United States Patent
Yung et al.

(10) Patent No.: US 9,099,376 B1
(45) Date of Patent: Aug. 4, 2015

(54) LASER DIRECT PATTERNING OF REDUCED-GRAPHENE OXIDE TRANSPARENT CIRCUIT

(71) Applicant: Nano and Advanced Materials Institute Limited, Hong Kong (HK)

(72) Inventors: Kam-Chuen Yung, Hong Kong (HK); Hai-Ming Liem, Hong Kong (HK); Hang-Shan Choy, Hong Kong (HK)

(73) Assignee: NANO AND ADVANCED MATERIALS INSTITUTE LIMITED, Hong Kong (HK)

( * ) Notice: Subject to any disclaimer, the term of this patent is extended or adjusted under 35 U.S.C. 154(b) by 0 days.

(21) Appl. No.: 14/297,644

(22) Filed: Jun. 6, 2014

(51) Int. Cl.
*H01L 21/336* (2006.01)
*H01L 29/16* (2006.01)
*H01L 21/02* (2006.01)
*H01L 21/268* (2006.01)

(52) U.S. Cl.
CPC ...... *H01L 29/1606* (2013.01); *H01L 21/02381* (2013.01); *H01L 21/02422* (2013.01); *H01L 21/02527* (2013.01); *H01L 21/02628* (2013.01); *H01L 21/02664* (2013.01); *H01L 21/268* (2013.01)

(58) Field of Classification Search
CPC .................................................. H01L 29/1606
USPC .......................................... 257/288; 438/197
See application file for complete search history.

(56) References Cited

U.S. PATENT DOCUMENTS

| | | | |
|---|---|---|---|
| 7,638,199 B2 | 12/2009 | Hirano et al. | |
| 8,317,984 B2 | 11/2012 | Gilje | |
| 2010/0200839 A1 | 8/2010 | Okai et al. | |
| 2011/0318257 A1 | 12/2011 | Sokolov et al. | |
| 2013/0001089 A1 | 1/2013 | Li et al. | |
| 2013/0065060 A1* | 3/2013 | Lee et al. | 428/420 |
| 2013/0180842 A1 | 7/2013 | Blanton et al. | |
| 2014/0147602 A1* | 5/2014 | Rafailovich et al. | 427/558 |

FOREIGN PATENT DOCUMENTS

| | | |
|---|---|---|
| CN | 102653190 A | 9/2012 |
| CN | 101723310 B | 6/2013 |

(Continued)

OTHER PUBLICATIONS

Cote L. J., et al, Graphene oxide as surfactant sheets, Pure Appl. Chem. vol. 83, No. 1, pp. 95-110, (2011).

(Continued)

*Primary Examiner* — Anthony Ho
(74) *Attorney, Agent, or Firm* — Ella Cheong Hong Kong; Sam T. Yip

(57) ABSTRACT

Reduced-graphene oxide circuits are directly patterned on glass substrate using an industrially available excimer laser system. A threshold of laser energy density is observed, which provide a clear differentiation on whether the graphene oxide is reduced. The highest conductivity measured is $7.142 \times 10^3$ S/m. The reduced-graphene oxide displays a transmittance greater than 80% across the entire range from 450 to 800 nm. The outstanding electrical, optical, and morphological properties have enabled reduced-graphene oxide to display promising applications, and this nano-processing method makes reduced-graphene oxide even more attractive when used as a transparent electrode for touch screens or in other applications.

14 Claims, 6 Drawing Sheets

(56) References Cited

FOREIGN PATENT DOCUMENTS

| CN | 103236295 A | 8/2013 |
|---|---|---|
| CN | 103508447 A | 1/2014 |
| WO | WO 2012128748 A1 | 9/2012 |
| WO | WO 2013188924 A1 | 12/2013 |

OTHER PUBLICATIONS

Wenzel R. N., Resistance of Solid Surfaces to Wetting by Water, Ind. Eng. Chem. vol. 28, No. 8, p. 988-994, (1936).

Erickson K., et al, Determination of the Local Chemical Structure of Graphene Oxide and Reduced Graphene Oxide, Advanced Materials, vol. 22, p. 4467-4472, (2010).

Zhang Y., et al, Direct imprinting of microcircuits on graphene oxides film by femtosecond laser reduction, Nano Today (2010) 5, 15-20.

Zeng X., et al, Experimental investigation of ablation efficiency and plasma expansion during femtosecond and nanosecond laser ablation of silicon, Appl. Phys. A 80,237-241 (2005).

Weingärtner M., et al, Patterning of silicon—differences between nanosecond and femtosecond laser pulses, Applied Surface Science 138-139 (1999) 499-502.

Wang S., et al, Wettability and Surface Free Energy of Graphene Films, Langmuir 2009, 25(18), 11078-11081.

\* cited by examiner

LASER DIRECT PATTERNING OF REDUCED-GRAPHENE OXIDE TRANSPARENT CIRCUIT

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

The present invention relates to a reduced-graphene oxide circuit, and more particularly relates to a method for fabricating the reduced-graphene oxide circuit.

BACKGROUND

Graphene is a flat monolayer of $sp^2$-hybridized carbon atoms tightly packed into a two-dimensional (2D) honeycomb structure. It has attracted growing attention owing to its superior thermal conductivity, electrical conductivities, and mechanical strength that rivals the notable in-plane values of graphite (~3000 W/m K, 8000 S/m, and 1000 GPa, respectively).

In addition, graphene is a zero-bandgap semiconductor with a linear band structure near the k-point. At high optical intensities, the photo-generated carriers block further absorption. The high frequency conductivity for Dirac fermions in graphene should be a universal constant equal to $e^2/4h$. This unique property gives graphene a universal 2.3% linear optical absorption that makes it transparent, despite its high conductivity.

Much effort has focused on its fabrication since its first creation by micro-exfoliation in 2004. Besides micro-exfoliation, fabricating methods developed include thermal chemical vapor deposition techniques, plasma enhanced chemical vapor deposition, chemical methods, thermal decomposition of SiC, un-zipping CNTs, etc.

CN103508447 discloses a preparation method of graphene. The method comprises the steps of: obtaining graphene oxide and a substrate; preparing a paste of graphene oxide and coating the paste on the surface of the substrate; and preparing the graphene by a laser reduction method. Nevertheless, this method needs a special gaseous environment during the laser reduction process, leading to increase of production cost. In addition, the graphene formed is easily peeled off from the substrate.

WO2012128748 discloses a method to fabricate patterned graphite oxide films. The method comprises the steps of: selecting a graphite oxide membrane, wherein the graphite oxide membrane is a freestanding graphite oxide membrane; forming a pattern on the graphite oxide membrane to form a patterned graphite oxide membrane, wherein the pattern is formed by reducing a portion of the graphite-oxide membrane to conducting reduced graphite oxide; and forming a device that comprises the patterned graphite oxide membrane, and cutting a pattern from tape. Nevertheless, it is complicate and unsecure to attach the freestanding graphite oxide membrane on other components by using tape for device formation.

CN101723310 discloses a method for preparing a conductive graphene oxide using micro-nano structure light processing. The method comprises the steps of: forming graphene oxide on a substrate by spin coating, dip coating or drop coating; setting up nanofabrication laser system; and reducing the graphene oxide on the substrate into graphene. The laser system operates in a double beam interference mode, and interference fringes are used. Nevertheless, under such system, the patterned size is very small (50×50 μm) in micro (μm) scale and the processing efficiency is low. In addition, as point-to-point and interference laser scanning system are used to fabricate the micro-nano structures, the fabricated surface will thus be discrete in nature, so surface quality (also product surface details) is then limited.

Consequently, there is an unmet need to have a method for fabricating conducting graphene oxide devices or circuits being applicable for different applications, and in an efficient way.

SUMMARY OF THE INVENTION

Accordingly, a first aspect of the presently claimed invention is to provide a reduced-graphene oxide circuit.

According to an embodiment of the presently claimed invention, a reduced-graphene oxide circuit comprises a substrate, a hydrophilic layer formed on the substrate, a graphene oxide (GO) layer formed on the hydrophilic layer, and a pattern of reduced-graphene oxide (rGO) formed on the graphene oxide layer.

A second aspect of the presently claimed invention is to provide a method for fabricating the reduced-graphene oxide circuit.

According to an embodiment of the present claimed invention, a method for fabricating the reduced-graphene oxide circuit comprises the steps of: providing a substrate; forming a hydrophilic layer on the substrate; forming a graphene oxide layer on the hydrophilic layer; and reducing a portion of the graphene oxide layer into reduced graphene oxide by a laser to form a pattern of reduced graphene oxide on the graphene oxide layer.

The step of forming a graphene oxide layer further comprises: providing a graphene oxide solution; spin-coating the graphene oxide solution on the hydrophilic layer; and drying the graphene oxide solution on the hydrophilic layer.

Preferably, a nano-second laser (248 nm) is used to selectively reduce graphene oxide to fabricate pre-defined reduced-graphene oxide patterns.

According to an embodiment of the presently claimed invention, compared with the photolithographic etching process, the laser patterning process is suitable to fabricate reduced-graphene oxide circuitry with good transparency (Optical transmittance=83% (at wavelength=555 nm)), high electrical conductivity ($\sigma=7.142\times10^3$ S/m (at layer thickness of 12.2 nm)), and high hydrophobicity (highest contact angle=115°).

In addition, the method of the present invention provides many advantages including fast prototyping, reduced technical steps, high throughput, no chemicals, environmentally friendly, high yields, high resolution, and precision.

BRIEF DESCRIPTION OF THE DRAWINGS

Embodiments of the present invention are described in more detail hereinafter with reference to the drawings, in which.

DETAILED DESCRIPTION OF PREFERRED EMBODIMENTS

In the following description, reduced-graphene oxide circuits, and the corresponding embodiments of the fabrication methods are set forth as preferred examples. It will be apparent to those skilled in the art that modifications, including additions and/or substitutions, may be made without departing from the scope and spirit of the invention. Specific details may be omitted so as not to obscure the invention; however, the disclosure is written to enable one skilled in the art to practice the teachings herein without undue experimentation.

Figure 1:
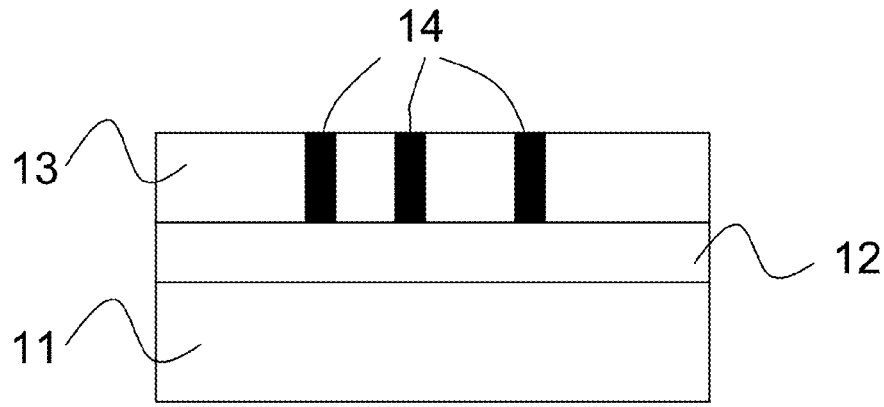
FIG. 1 is a cross sectional diagram of a reduced-graphene oxide circuit according to an embodiment of the presently claimed invention.

FIG. 1 is a cross sectional diagram of a reduced-graphene circuit according to an embodiment of the presently claimed invention. The reduced-graphene circuit comprises a substrate 11, a hydrophilic layer 12, a graphene oxide layer 13, and a pattern of reduced graphene oxide 14. The hydrophilic layer 12 is formed on the surface of the substrate 11. The graphene oxide layer 13 is formed on the surface of the hydrophilic layer 12. The pattern of the reduced graphene oxide 14 is formed on the graphene oxide layer 13.

Figure 2:
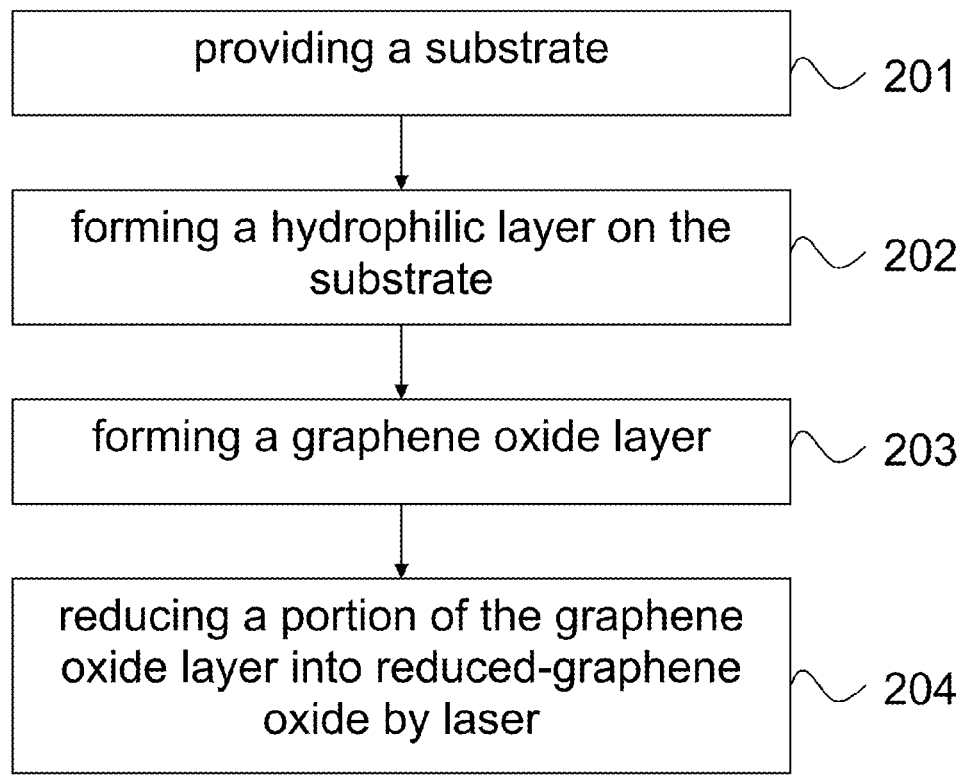
FIG. 2 is a flow chart showing the steps of a method for fabricating a reduced-graphene oxide circuit according to an embodiment of the presently claimed invention.

FIG. 2 is a flow chart showing the steps of a method for fabricating a reduced-graphene oxide circuit according to an embodiment of the presently claimed invention. In step 201, a substrate is provided. In step 202, a hydrophilic layer is formed on the surface of the substrate. In step 203, a graphene oxide layer is formed on the surface of the hydrophilic layer. In step 204, a portion of the graphene oxide layer is reduced into reduced graphene oxide by laser to pattern the reduced-graphene oxide circuit.

Figure 3:
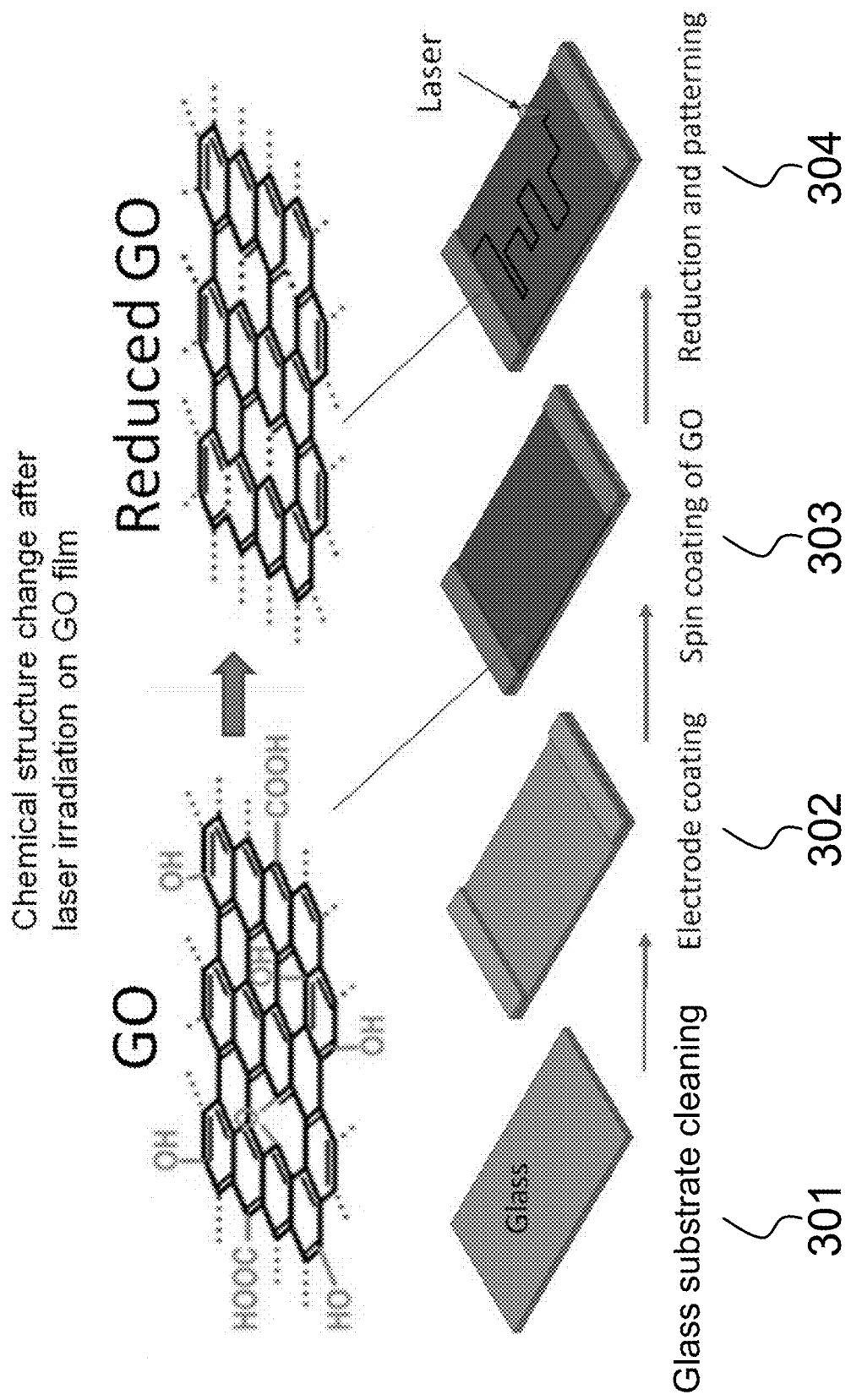
FIG. 3 is a schematic diagram showing the steps of a method for fabricating a reduced-graphene oxide micro-circuit according to an embodiment of the presently claimed invention.

FIG. 3 is a schematic diagram showing the steps of a method for fabricating a reduced-graphene oxide micro-circuit according to an embodiment of the presently claimed invention. The reduced-graphene oxide micro-circuit is patterned through reduction of graphene oxide by a nano-second laser for electrical conduction.

In step 301, a glass substrate is cleaned by a piranha solution to form a hydrophilic layer disposed on the surface of the glass substrate. In step 302, electrodes are coated on the cleaned glass substrate. In step 303, a GO layer is coated on the hydrophilic layer by spin coating. In step 304, a portion of the GO layer is reduced into rGO by the nano-second laser to form a pattern of the micro-circuit. As shown in FIG. 3, the black lines on the GO layer represent rGO.

Figure 4:
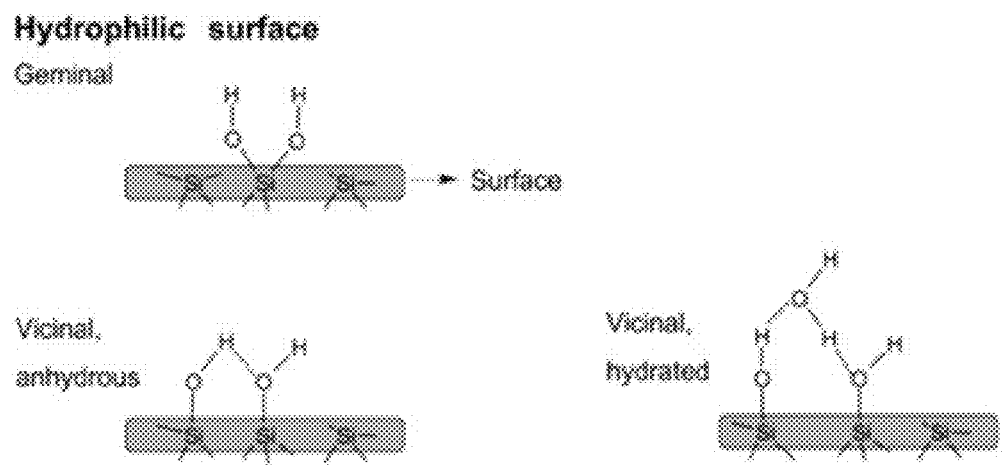
FIG. 4 shows a plurality of hydrophilic surfaces formed by treating substrates with piranha solution according to various embodiments of the presently claimed invention.

In step 301, to improve the hydrophilicity of the glass substrate, the glass substrate is treated with the piranha solution, which can be produced by reacting concentrated sulphuric acid with hydrogen peroxide solution in the volume ratio of 2:1. Patterning the GO layer on the treated glass substrate can reduce the rGO thickness and increase its conductivity. The hydrogen ions in the piranha solution can react with the silicon on the glass surface to form a silanol group, Si—OH as shown in FIG. 4. For silica on the surface of the treated glass substrate being amorphous, it has a randomly arranged bond structure, resulting in open, reactive, or dangling bonds throughout the material. At the surface of silica, silanol groups are formed at these bonds in air. The hydroxyl group (—OH) makes the silanol group very reactive. The silanol groups are hydrophilic, leading to the formation of water layers. Organic and inorganic molecules and atoms can bind physically, chemically, or electrostatically to the water molecules or the silanol groups themselves under ambient conditions. As the silanol group is a polar group, water can be adhered to the surface better by forming a hydrogen bonding between the silanol group and the water molecules.

Accordingly, the hydrophilic layer can comprise a geminal group, a vicinal and anhydrous group, a vicinal and hydrated group, or their combinations thereof. Preferably, the hydrophilic layer is about 0.1 nm in thickness.

Accordingly, the substrate is not limited to glass. Other transparent substrates are applicable. Silicon substrate can also be used.

In step 303, GO dispersed in water is used with a composition of 79% carbon and 20% oxygen by weight and a concentration of 500 mg/liter. The flake size is in the range of 0.5-5.0 μm. The GO solution is spun coated by a spin coater at a spinning speed ranged from 400 to 700 rpm on the hydrophilic layer with 60 s. The GO solution coated on the hydrophilic layer is dried at 95° C. for 30 min. The as-prepared GO layer is used for further processing by the nano-second laser.

In step 304, the laser reduction of GO is performed by using a GSI Lumonics PulseMaster PM-848 KrF excimer laser (20 ns pulse width and 200 μm/s scan speed) with a wavelength of 248 nm. A 300×300 μm$^2$ aperture is imaged onto a sample at approximately 30:1 reduction using a projection beam line, and produce a rectangular spot on the GO layer with size ~10×10 μm$^2$. The excimer laser is able to selectively reduce the GO on the GO layer to fabricate predefined reduced-graphene oxide patterns. To observe the change in the GO layer resistance as a function of laser energy, the laser is operated at a repetition rate of 1 Hz, and its output energy density is controlled in a range from 60 to 100 mJ/cm$^2$.

According to an embodiment of the presently claimed invention, the conditions of laser reduction process comprise a pulse duration of 20 ns, a spot size with 0.8×0.8 mm$^2$, a repetition rate of 1 Hz, and a defocus distance of −3.5 cm.

Photochemical reaction between GO and laser light is complex. As shown in FIG. 3, there are C—C bonds and C—O bonds around the graphene (C═C bond) in GO. A C═C bond is 13% shorter but 76% stronger than that of a C—C bond, whereas a C—O bond is 15% shorter but over 100% stronger than a C—O bond. The photon energy of the laser light can cleave a C—C bond and C—O bond in GO at first because the C═C bond is stronger than the C—C bond and C—O bond. GO is then reduced to reduced-graphene oxide, or even graphene. The thickness and evenness of the GO layer can be modified by changing the dipping volume and temperature of the glass substrate.

Due to the ionizable edge —COOH groups easily dispersed in water, GO is classified as hydrophilic. Its basal plane, however, contains polyaromatic islands of unoxidized graphene hydrophobic nanodomains which have been observed by aberration corrected transmission electron microscopy. GO has an edge-to-centre distribution of hydrophilic and hydrophobic domains which make it exhibit amphiphilicity. When GO adheres to substrates or interfaces, the consequence of this property is to lower interfacial energy which can effectively stabilize the interfaces. The extent of amphiphilicity can be modified by changing the pH value of the GO solution, layer thickness and the degree of reduction of GO.

Small contact angles (<90°) correspond to high wettability, while large contact angles (>90°) correspond to low wettability. The GO layer is grafted with hydroxyl and epoxy groups. After reduction of GO by laser, hydroxyl and epoxy groups have been eliminated. The maximum calculated static contact angle between rGO and water is 127°. It is thus desirable to realize high hydrophobicity of rGO or graphene in conjunction with surface roughness with a suitable dimension, which allows for high optical transparency and conductivity.

According to an embodiment of the presently claimed invention, the contact angle of the transparent film of rGO is measured to be 115°, indicating a substantial improvement over that of a GO layer with 38°. As water on hydrophobic surfaces exhibits a high contact angle, it can provide self-cleaning ability. Due to the high values of hydrophobicity of the rGO of the present invention, water or moisture is easily repelled for attaining self-cleaning ability.

Figure 5A:
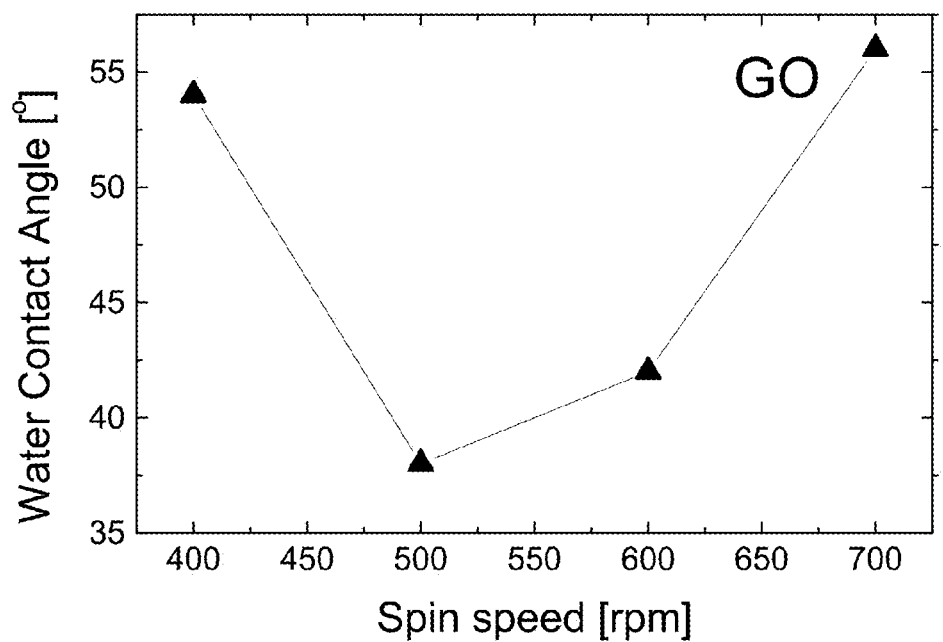
FIG. 5A and FIG. 5B show the static water contact angles of GO and rGO layers respectively, with various spin speeds according to an embodiment of the presently claimed invention.
Figure 5B:
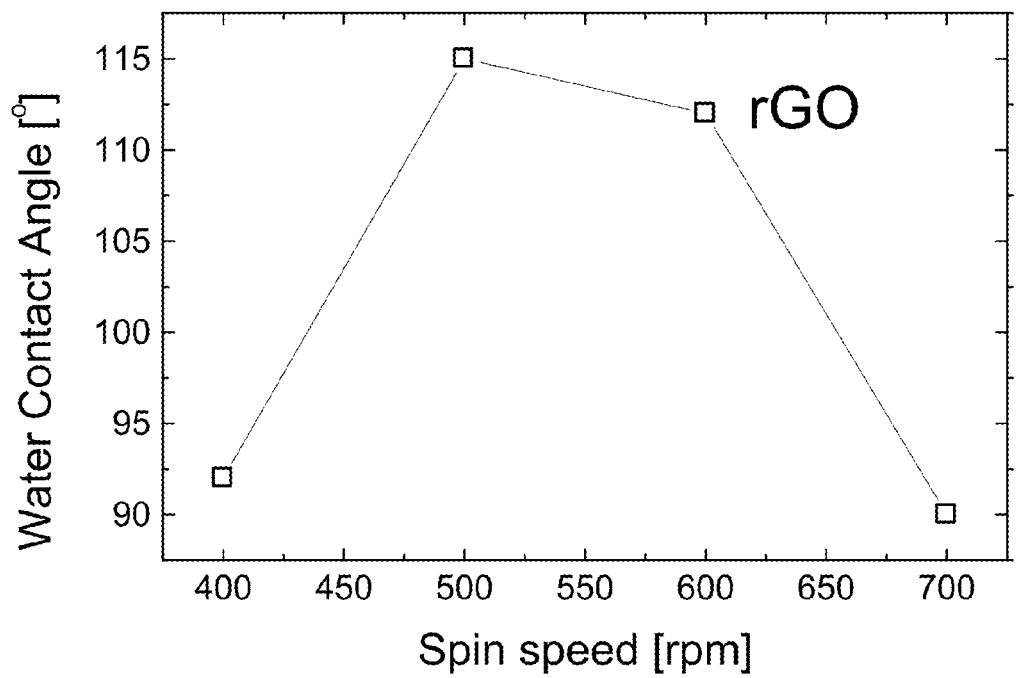

FIG. 5A and FIG. 5B show the static water contact angles of GO and rGO layers respectively, with various spin speeds. The GO layers display high hydrophilicity with spin speeds from 400 to 700 rpm. The angle of GO decreases initially when the spinning speed increases but then increases back to about 55° for further increase of speed. The opposite effect is observed with that of rGO. The results show that the hydrophilic GO layers can be changed to hydrophobic ones by laser reduction.

GO is amphipilic with an edge-to-center distribution of hydrophilic and hydrophobic domains. GO can adhere to interfaces and lower interfacial energy, acting as surfactant. The GO film is spin-coated on glass (having a water contact angle of 53.5°), and reflects the similar roughness of the underlying glass substrate by having a similar water contact angle of 54°. During the spin coating, there is a rapid evaporation of the water and some graphene oxide flakes, and this can be somewhat inhomogeneous depending on the local thickness of the layer and the spinning speed. There is a competition between the adhesion force with glass and centrifugal force. Therefore, there is a region where the GO flakes have been quenched in a relatively more hydrophilic nonequilibrium state (with spin speeds 500 and 600 rpm), and a relatively disorder state in which the GO flakes have a lesser time to equilibrate themselves prior to solidification. The different values of contact angle in the spin speed of FIG. 5A are, thus, a manifestation of the different disorders in different layers according to the average time they have to solidify.

FIG. 5B shows the opposite effect of spin speed on the water contact angle of rGO. According to the Wenzel model, the roughness effect of a graphene film amplifies the inherent wettability of the substrate material. Therefore if an individual graphene film is hydrophilic, then a rough graphene film is expected to be superhydrophilic and, conversely, if an individual graphene is hydrophobic, then the Wenzel model predicts that a rough film would display superhydrophobic response. GO film is grafted with hydroxyl and epoxy groups. After reduction of GO by laser, hydroxyl and epoxy groups have been eliminated. This resulted in transforming the hydrophilicity nature of GO to hydrophobicity. The highest contact angle between rGO and water is about 115°.

Preferably, the spin speed of the spin coater is in the range of 475 to 525 rpm for achieving high hydrophilicity of the GO layer and high hydrophobicity of the rGO layer in order to obtain better surface contact between the glass substrate and GO layer, as well as high self-cleaning ability. Preferably, the spin speed of the spin coater is about 500 rpm.

Figure 6:
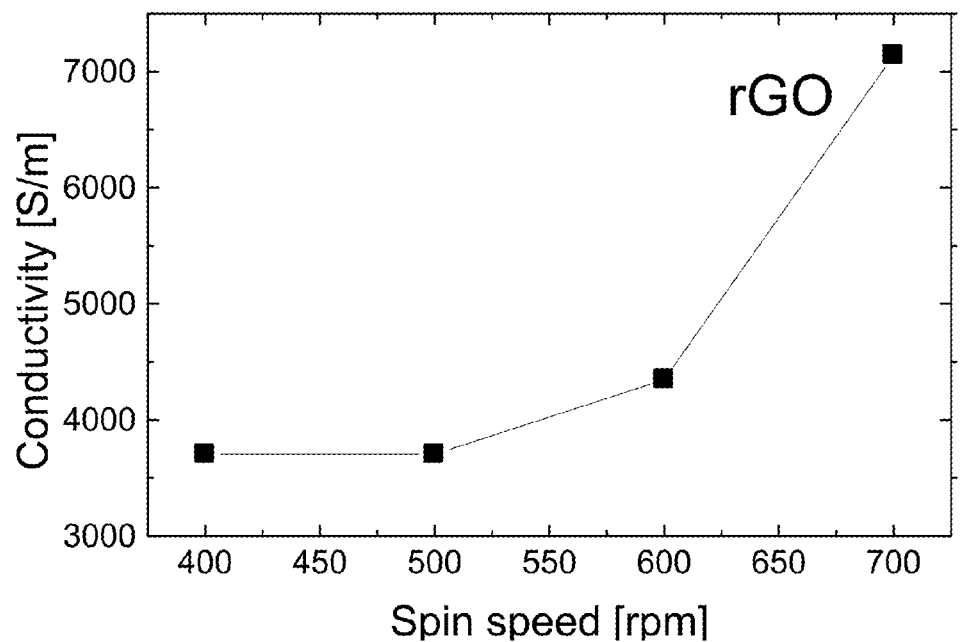
FIG. 6 shows the conductivities of a rGO layer as a function of spin speed according to an embodiment of the presently claimed invention.
Figure 7:
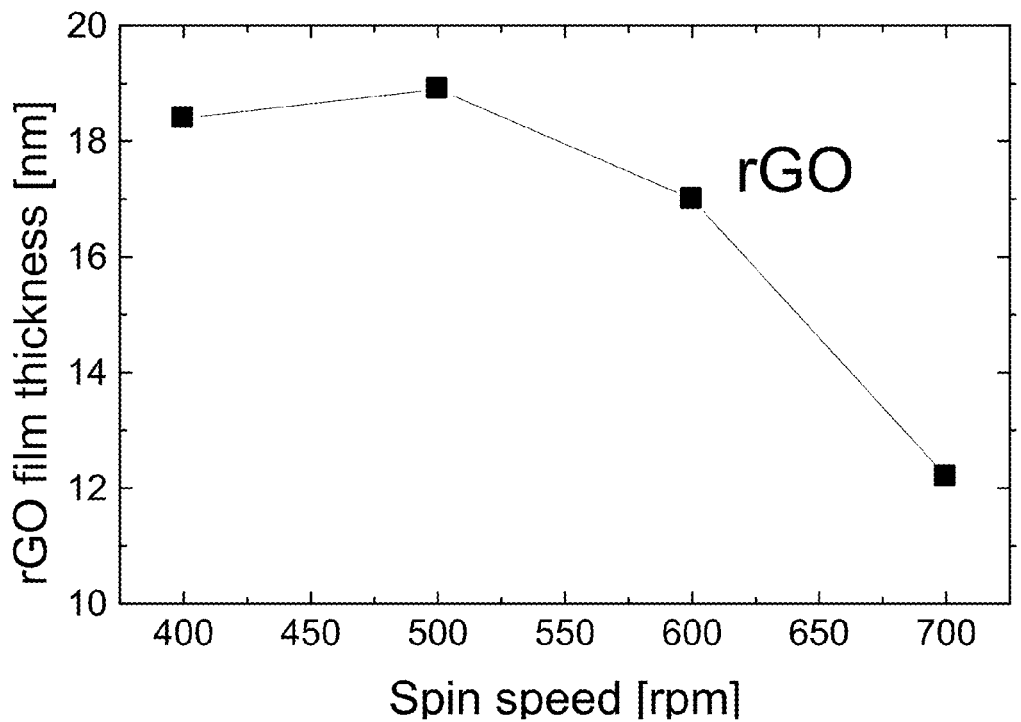
FIG. 7 shows the thickness of a rGO layer as a function of spin speed according to an embodiment of the presently claimed invention.

FIG. 6 shows the conductivities of a rGO layer as a function of spin speed. It is calculated to be $7.142 \times 10^3$ S/m for a spin speed of 700 rpm. The increase in conductivity is due to the fact that more GO is reduced to reduced graphene oxide or graphene when the spin speed is increased, even though the film thickness is reduced. FIG. 7 shows the thickness of a rGO layer as a function of spin speed. The thinnest thickness achieved is 12.2 nm at a spin speed of 700 rpm.

Preferably, the spin speed of the spin coater is in the range of 650 to 700 rpm for attaining high electrical conductivity with low layer thickness. Preferably, the spin speed of the spin coater is about 700 rpm.

Figure 8:
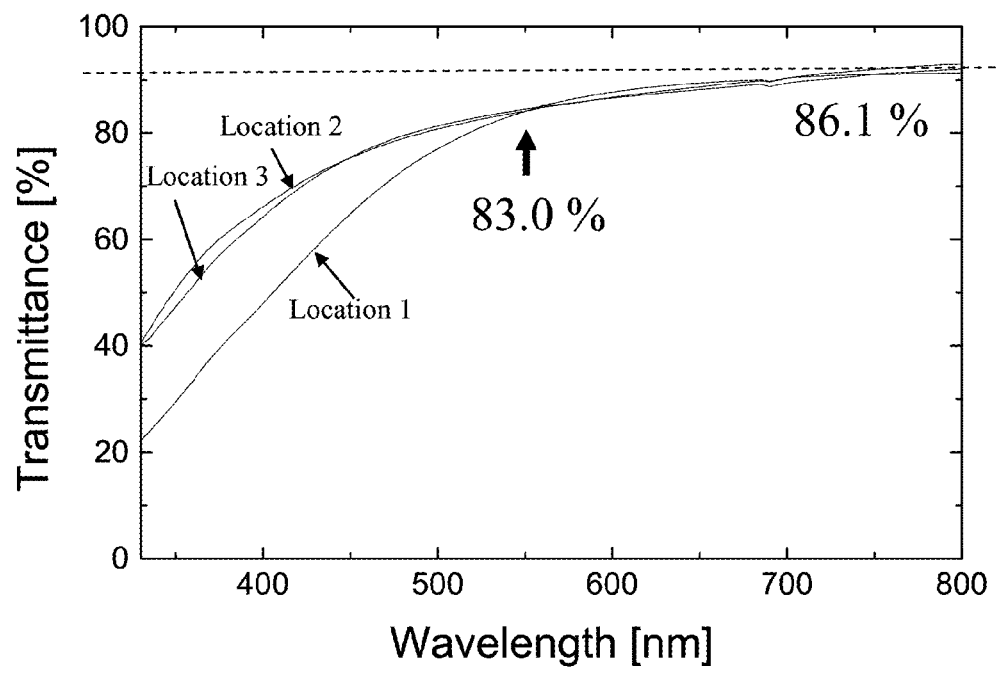
FIG. 8 is an ultraviolet-visible (UV/vis) transmission spectra for a rGO layer at three spots according to an embodiment of the presently claimed invention.

FIG. 8 is an UV/vis transmission spectra of a rGO layer at three spots (arbitrary location 1 to 3) according to an embodiment of the presently claimed invention. It shows the optical transmittance from 350 nm to 800 nm for the rGO layer at different spots within the sample. The transmittance drops rapidly at wavelengths below 400 nm. The rGO displays a transmittance greater than about 80% across the entire range from 450-800 nm. Therefore, the great advantages of the rGO circuits are that they have a broad optical transparency, which makes these electrodes highly suitable for transparent electrodes for touch screens, and they can be made remarkably thin (~12.2 nm) with low surface roughness, and also retain sufficient conductivity.

Figure 9:
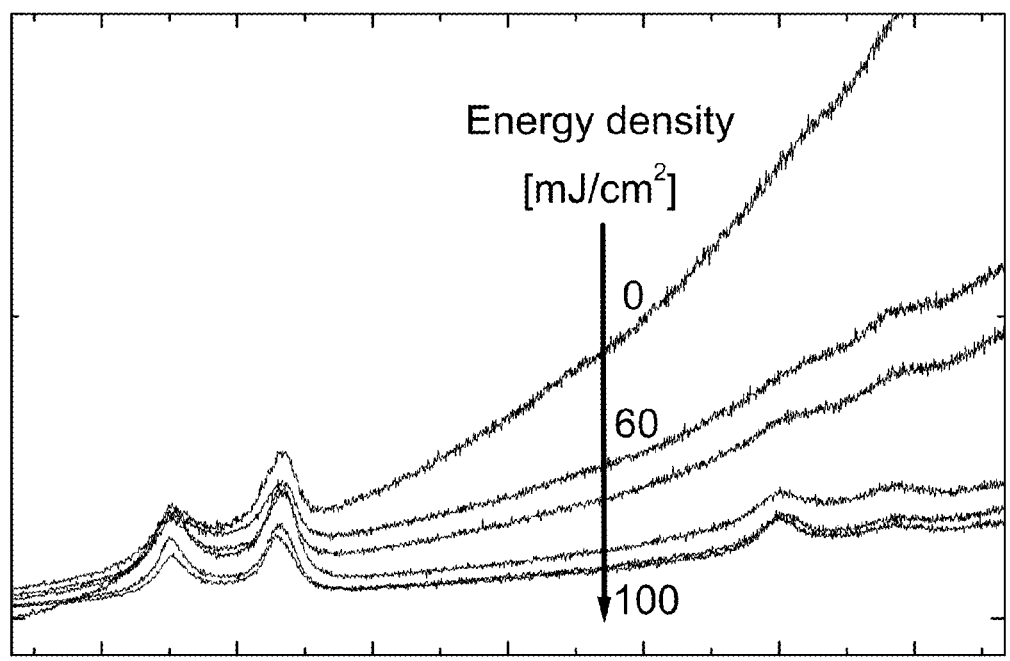
FIG. 9 is a Raman spectra of a GO layer before and after laser patterning with various energy densities (60-100 mJ/cm$^2$) according to an embodiment of the presently claimed invention.

FIG. 9 is a Raman spectra of a GO layer before and after laser patterning with various energy densities (60-100 mJ/cm$^2$) according to an embodiment of the presently claimed invention. A 2D peak which features the successful reduction of GO is observed.

Due to the outstanding properties mentioned above, the reduced-graphene oxide circuit of the present invention is particularly applicable as a transparent electrode for touch screens.

The foregoing description of the present invention has been provided for the purposes of illustration and description. It is not intended to be exhaustive or to limit the invention to the precise forms disclosed. Many modifications and variations will be apparent to the practitioner skilled in the art.

The embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the following claims and their equivalence.

What is claimed is:

1. A method for fabricating a reduced-graphene oxide circuit, comprising:
   providing a substrate;
   forming at least one hydrophilic layer on the substrate;
   forming at least one graphene oxide layer on the hydrophilic layer; and reducing a portion of the graphene oxide layer into reduced graphene oxide by a laser to form at least one pattern of the reduced graphene oxide on the graphene oxide layer;
wherein the hydrophilic layer is formed by applying piranha solution to react with a surface of the substrate.

2. The method of claim 1, wherein the substrate comprise glass or silicon.

3. The method of claim 1, wherein the hydrophilic layer is formed by a chemical reaction of hydrogen ions with a surface of the substrate.

4. The method of claim 1, wherein the piranha solution comprises sulphuric acid and hydrogen peroxide solution in a volume ratio of about 2 to 1.

5. The method of claim 1, wherein the step of forming the graphene oxide layer further comprises:
providing a graphene oxide solution;
spin-coating the graphene oxide solution on the hydrophilic layer; and
drying the graphene oxide solution on the hydrophilic layer.

6. The method of claim 5, wherein the graphene oxide solution comprises graphene flake with size of 0.5 to 5 μm dissolved in water.

7. The method of claim 5, wherein the step of spin-coating the graphene oxide solution on the hydrophilic layer further comprises a spinning speed of 400 to 700 rpm.

8. The method of claim 5, wherein the step of spin-coating the graphene oxide solution on the hydrophilic layer further comprises a spinning speed of 650 to 700 rpm.

9. The method of claim 5, wherein the step of spin-coating the graphene oxide solution on the hydrophilic layer further comprises a spinning speed of 475 to 525 rpm.

10. The method of claim 5, wherein the step of spin-coating the graphene oxide solution on the hydrophilic layer further comprises a spinning speed of about 500 rpm.

11. The method of claim 1, wherein the laser is a nanosecond laser, or an excimer laser with a wavelength of about 248 nm.

12. The method of claim 1, wherein the step of reducing a portion of the graphene oxide layer into reduced graphene oxide is performed under conditions including the laser being an excimer laser with a wavelength of about 248 nm, a pulse duration of 20 ns, a spot size with $0.8\times0.8$ mm$^2$, a repetition rate of 1 Hz, and a defocus distance of $-3.5$ cm.

13. A method for fabricating a reduced-graphene oxide circuit, comprising:
providing a substrate;
forming at least one hydrophilic layer on the substrate;
forming at least one graphene oxide layer on the hydrophilic layer; and
reducing a portion of the graphene oxide layer into reduced graphene oxide by a laser to form at least one pattern of the reduced graphene oxide on the graphene oxide layer;
wherein the step of forming the graphene oxide layer further comprises:
providing a graphene oxide solution;
spin-coating the graphene oxide solution on the hydrophilic layer; and
drying the graphene oxide solution on the hydrophilic layer; and
wherein the graphene oxide solution comprises graphene flake with size of 0.5 to 5 μm dissolved in water.

14. A method for fabricating a reduced-graphene oxide circuit, comprising:
providing a substrate;
forming at least one hydrophilic layer on the substrate;
forming at least one graphene oxide layer on the hydrophilic layer; and
reducing a portion of the graphene oxide layer into reduced graphene oxide by a laser to form at least one pattern of the reduced graphene oxide on the graphene oxide layer;
wherein the step of reducing a portion of the graphene oxide layer into reduced graphene oxide is performed under conditions including the laser being an excimer laser with a wavelength of about 248 nm, a pulse duration of 20 ns, a spot size with $0.8\times0.8$ mm$^2$, a repetition rate of 1 Hz, and a defocus distance of $-3.5$ cm.

* * * * *